(12) United States Patent
Igaki et al.

(10) Patent No.: US 7,026,654 B2
(45) Date of Patent: Apr. 11, 2006

(54) PACKAGE FOR OPTICAL SEMICONDUCTOR

(75) Inventors: Masahiko Igaki, Kanagawa (JP); Makoto Ogura, Kanagawa (JP); Akio Atsuta, Kanagawa (JP); Tadashi Kosaka, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/406,943

(22) Filed: Apr. 3, 2003

(65) Prior Publication Data

US 2003/0189213 A1    Oct. 9, 2003

(30) Foreign Application Priority Data

Apr. 5, 2002   (JP)   .............. 2002-103628
Mar. 26, 2003  (JP)   .............. 2003-085357

(51) Int. Cl.
| H01L 29/26 | (2006.01) |
| H01L 27/15 | (2006.01) |
| H01L 33/00 | (2006.01) |
| H01L 27/14 | (2006.01) |
| H01L 31/00 | (2006.01) |

(52) U.S. Cl. .............. 257/80; 257/82; 257/13; 257/21; 257/53; 257/79; 257/88; 257/9.14; 257/431; 257/432; 257/433; 257/435

(58) Field of Classification Search .............. 257/79, 257/80, 98, 100; 438/123
See application file for complete search history.

(56) References Cited

U.S. PATENT DOCUMENTS

| 4,565,924 | A | * | 1/1986 | Misumi et al. ........ 250/227.11 |
| 4,977,317 | A | * | 12/1990 | Iwashima .............. 250/239 |
| 5,171,985 | A | * | 12/1992 | Kawaguchi ........... 250/239 |
| 5,177,357 | A | * | 1/1993 | Yamaguchi et al. ... 250/231.16 |
| 5,233,177 | A | * | 8/1993 | Kobayashi et al. ..... 250/208.1 |
| 5,285,085 | A | * | 2/1994 | Onishi .................. 257/82 |
| 5,291,038 | A | * | 3/1994 | Hanamoto et al. ......... 257/82 |
| 5,779,631 | A | * | 7/1998 | Chance ................ 600/328 |
| 5,785,768 | A | * | 7/1998 | Nakata .................. 136/250 |
| 6,011,254 | A | * | 1/2000 | Sano et al. ............. 250/231.1 |
| 6,091,497 | A | * | 7/2000 | Paritsky et al. ........... 356/623 |
| 6,104,023 | A | * | 8/2000 | Maeda ................... 250/231.13 |
| 6,507,048 | B1 | * | 1/2003 | Makiya ................ 257/81 |
| 6,625,036 | B1 | * | 9/2003 | Horio .................. 361/760 |
| 6,740,862 | B1 | * | 5/2004 | Paritsky et al. ............ 250/221 |
| 6,822,750 | B1 | * | 11/2004 | Paritsky et al. ............ 356/622 |
| 2002/0009112 | A1 | * | 1/2002 | Nakata ................. 372/50 |
| 2002/0021813 | A1 | * | 2/2002 | Moriguchi et al. ........ 381/172 |
| 2002/0051239 | A1 | * | 5/2002 | Fukumoto et al. ......... 358/471 |
| 2002/0053742 | A1 | * | 5/2002 | Hata et al. .............. 257/774 |
| 2002/0088981 | A1 | * | 7/2002 | Suzuki ................... 257/79 |
| 2002/0195611 | A1 | * | 12/2002 | Yamabayashi et al. ...... 257/98 |
| 2003/0042403 | A1 | * | 3/2003 | Joshi .................... 250/214.1 |
| 2003/0059178 | A1 | * | 3/2003 | Kobayashi et al. ......... 385/94 |
| 2003/0173506 | A1 | * | 9/2003 | Paritsky et al. ........ 250/227.14 |

FOREIGN PATENT DOCUMENTS

JP   357017187   * 1/1982

(Continued)

*Primary Examiner*—Carl Whitehead, Jr.
*Assistant Examiner*—James M. Mitchell
(74) *Attorney, Agent, or Firm*—Morgan & Finnegan, L.L.P.

(57) ABSTRACT

To provide a package for an optical semiconductor having a light-emitting device and a light-receiving device in one package, in which a groove is provided between the light-emitting device and the light-receiving device to thereby avoid rays of light from the light-emitting device to directly enter the light-receiving device.

5 Claims, 11 Drawing Sheets

FOREIGN PATENT DOCUMENTS

| | | | |
|---|---|---|---|
| JP | 359086272 | * | 5/1984 |
| JP | 60-016475 | * | 1/1985 |
| JP | 402154475 | * | 6/1990 |
| JP | 03-142939 | * | 6/1991 |
| JP | 411261493 | * | 9/1999 |
| JP | 411289105 | * | 10/1999 |
| JP | 2000-150951 | * | 5/2000 |
| JP | 2001024213 I | * | 1/2001 |
| JP | 2001-291893 | * | 10/2001 |
| JP | 2003131085 | * | 5/2003 |

* cited by examiner

PACKAGE FOR OPTICAL SEMICONDUCTOR

BACKGROUND OF THE INVENTION

1. Field of the Invention

The present invention relates to a package for an optical semiconductor in which a light-emitting device and a light-receiving device are placed within a single package.

2. Related Background Art

FIG. 14 shows a conventional light-emitting/receiving device. In this drawing, reference numeral 100 denotes a bottomed device case whose inside is divided into two inside portions by a partition board 102.

Reference numerals 103 and 104 denote lead frames that respectively have supporting portions 103a and 104a at their tips. These lead frames are allowed to pass through a side portion of the device case 100 and are fixed to the device case 100. In more detail, the tip of the lead frame 103 is allowed to enter into one of the two inside portions of the device case 100, while the tip of the lead frame 104 is allowed to enter into the other of the two inside portions of the device case 1. Reference numerals 105 and 106 represent lead frames for connection and these lead frames 105 and 106 are allowed to pass through an opposite side portion of the device case 100. Each tip of these lead frames is allowed to enter into the device case 100 and is fixed to the device case 100 so as to oppose one of the tips of the lead frames 103 and 104. Also, a light-receiving device 107 is mounted on the supporting portion 103a of the lead frame 103 and a light-emitting device 108 is mounted on the supporting portion 104a of the lead frame 104. The light-receiving device 107 is connected to the lead frame 105 through a metallic wire 109 and the light-emitting device 108 is connected to the lead frame 106 through a metallic wire 100.

In the device case 100 described above, a transparent resin material in a liquid state is filled into each of the two inside portions and is hardened. This transparent resin material is filled so that its volume becomes smaller than the volume within the device case 100, thereby avoiding its overflow from the device case 100. Then, the transparent resin material is hardened, thereby protecting the light-receiving device 107, the light-emitting device 108, and the metallic wires 109 and 100 within the device case 100.

The optical semiconductor package described above is produced in a manner such that the rear end side of each of the lead frames 103, 104, 105, and 106 protruding to the outside of the device case 100 is fixed to tie bars 111 and 112 so that a plurality of optical semiconductor packages are produced so as to be connected with each other. Then, the tie bars 111 and 112 are cut and respective optical semiconductor packages are finally obtained, as shown in the drawing.

The optical semiconductor package described above has the following problems. First, the lead frames 103, 104, 105, and 106 provided for the optical semiconductor package are produced using a method such as etching, so that the price of the optical semiconductor package rises and it is difficult to bring down the price. Also, the frames 103, 104, 105, and 106 are delicate, so that it is required to pay close attention to handling of these frames during production work and therefore work efficiency is impaired.

Also, the mounting of the light-emitting device 108 and the light-receiving device 107 and the connecting of the metallic wires 109 and 110 are machine work but the opening portion of the device case 100 is extremely narrow (around 1.5 mm×2 mm, for instance), so that the work range of the machine is limited and therefore the machine work is slowed.

The liquid resin material having a light transmission property is filled in the device case 100 and is hardened. When doing so, the resin material is filled so that its volume becomes smaller than the volume within the device case 100, thereby avoiding overflow of the resin material from the device case 100 at the time of filling of the resin material. In this case, however, the surface shape of each of a light emitting portion and a light incident portion becomes like a concave lens, so that there occurs a problem that the enhancement of device accuracy is hindered by diffusion of light.

Further, positions of the protrusions of the lead frames 103, 104, 105, and 106 are elevated from the undersurface of the device case 100. Therefore, it is required to form the lead frames 103, 104, 105, and 106 so that these lead frames contact a mounting substrate when the optical semiconductor package is mounted on the mounting substrate. As a result, it is required to spend time and effort. In addition, the optical semiconductor package uses the device case 100, so that it is difficult to miniaturize the optical semiconductor package.

SUMMARY OF THE INVENTION

The present invention has been made in the light of the aforementioned problems of the optical semiconductor package, and has an object to provide an optical semiconductor package having a laminated structure in which a groove is provided at a position between a light-emitting device and a light-receiving device. Further, in order to enhance a light-shielding property, a resin having a light-shielding property is injected into the groove, or a sheet member having a light-shielding property is inserted into and mounted to the groove.

The optical semiconductor package constructed in this manner prevents unnecessary rays of light from impinging on a light-receiving surface and exhibits an excellent light-shielding performance without using a specialized device case. Therefore, the present optical semiconductor package is advantageous to miniaturization and makes it easy to perform machine work. Also, unlike the conventional device, the optical semiconductor package according to the present invention does not use high-priced lead frames, so that cost reduction is realized without difficulty and convenience in handling is also achieved. Other objects and constructions of the present invention will become apparent from the following embodiments.

DESCRIPTION OF THE PREFERRED EMBODIMENTS

<First Embodiment>

Figure 1:
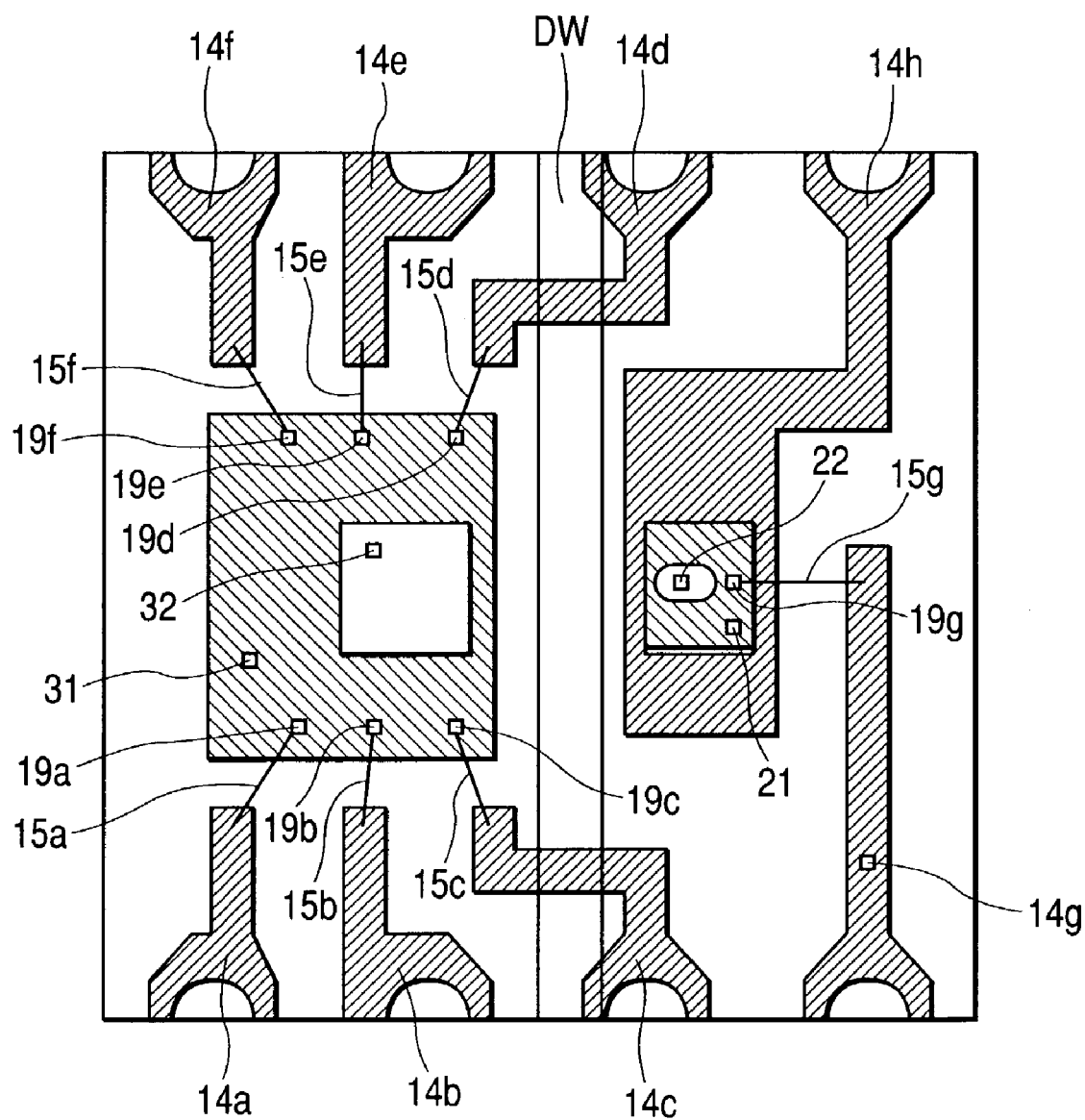
FIG. 1 is a plain view of an optical semiconductor package showing a first embodiment of the present invention.
Figure 2:
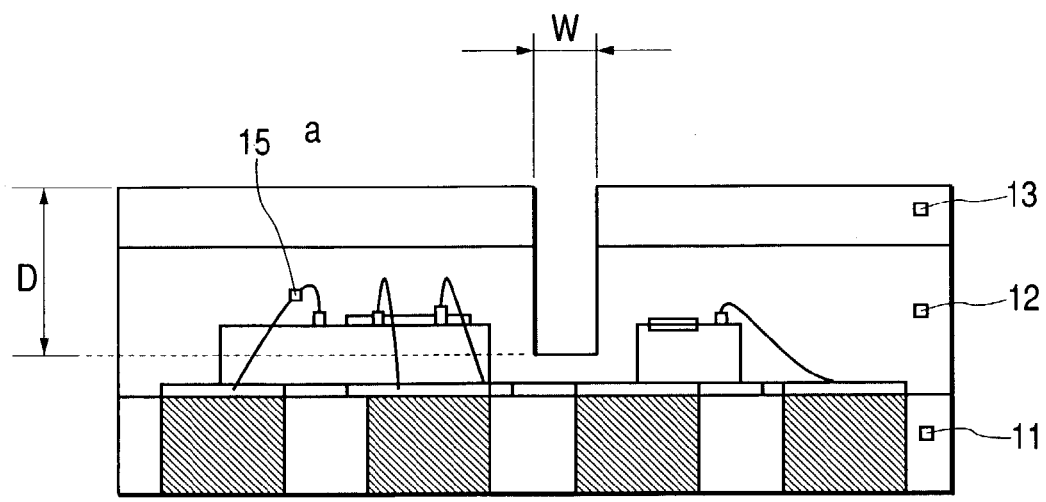
FIG. 2 is a side view of the optical semiconductor package.

Now, embodiments of the present invention will be described with reference to the accompanying drawings. FIG. 1 is a plain view of an optical semiconductor package of a first embodiment, while FIG. 2 is a side view of the optical semiconductor package. In these drawings, reference numeral 11 denotes a printed wiring board. This printed wiring board 11 includes a groove DW to be described later at approximately the center thereof, and a circuit pattern having a predetermined shape is formed immediately below the groove DW and on the right and left sides of the groove DW.

In FIG. 1, the circuit pattern formed immediately below the groove DW and on the right and left sides of the groove DW is composed of external connection terminals 14$a$ to 14$h$, electrodes 19$a$ to 19$g$ of a light-receiving device and a light-emitting device, and metallic wires 15$a$ to 15$g$ for connecting the external connection terminals to the electrodes.

The external connection terminals 14$a$ to 14$h$ described above are also formed on the side surfaces and underside surface of the printed wiring board 11, as shown in FIG. 2. The circuit pattern is also provided on the outer surface of the board 11 that coincides with rims of semicircular notches formed on the printed wiring board 11, and is connected to the terminals on the underside surface.

The light-receiving device 31 having a light-receiving surface 32 is fastened to a portion of the circuit pattern formed on the printed wiring board 11 and the light-emitting device 21 having a light-emitting region 22 is fastened to another portion of the circuit pattern. Also, the electrodes 19$a$ to 19$f$ of the light-receiving device 31 are connected to the external connection terminals 14$a$ to 14$f$ through the wires 15$a$ to 15$f$. An unillustrated electrode of the light-emitting device 21 is connected to the external connection terminal 14$e$ and the electrode 19$g$ is connected to the external connection terminal 14$g$ through the wire 15$g$.

The light-receiving device 31, the light-emitting device 21, and the wires 15$a$ to 15$g$ described above are protected by a surrounding member 12 formed using a transparent resin material. As is apparent from FIG. 2, the surrounding member 12 is required to have a height that is equal to or more than the heights of the components of the light-emitting device 21 and the light-receiving device 31 at the minimum, and the thickness of the member 12 is determined by giving attention to the loop heights of the wires 15$a$ to 15$g$ and margins required to bond the optical semiconductor components to the board.

The surrounding member 12 and a glass substrate 13 are formed on the printed wiring board 11. The groove of the present invention is formed so as to have a depth with which direct light from the light-emitting device 21 does not enter the light-receiving device 31 and the circuit pattern of the printed wiring board 11 is not cut. If the circuit pattern does not exist in this portion, there occurs no problem even if the groove depth is set so that the groove reaches the printed wiring board 11.

In this embodiment, as shown in FIG. 1, the wiring patterns are arranged immediately below the groove. Therefore, the groove is provided so as to have a depth that is somewhat shallower than the total thickness of the surrounding member 12 and the transparent glass substrate 13, as shown in FIG. 2. By setting the groove depth in this manner, there is protected the circuit pattern. As a result, the light-emitting device and the light-receiving device can be connected electrically.

Figure 3:
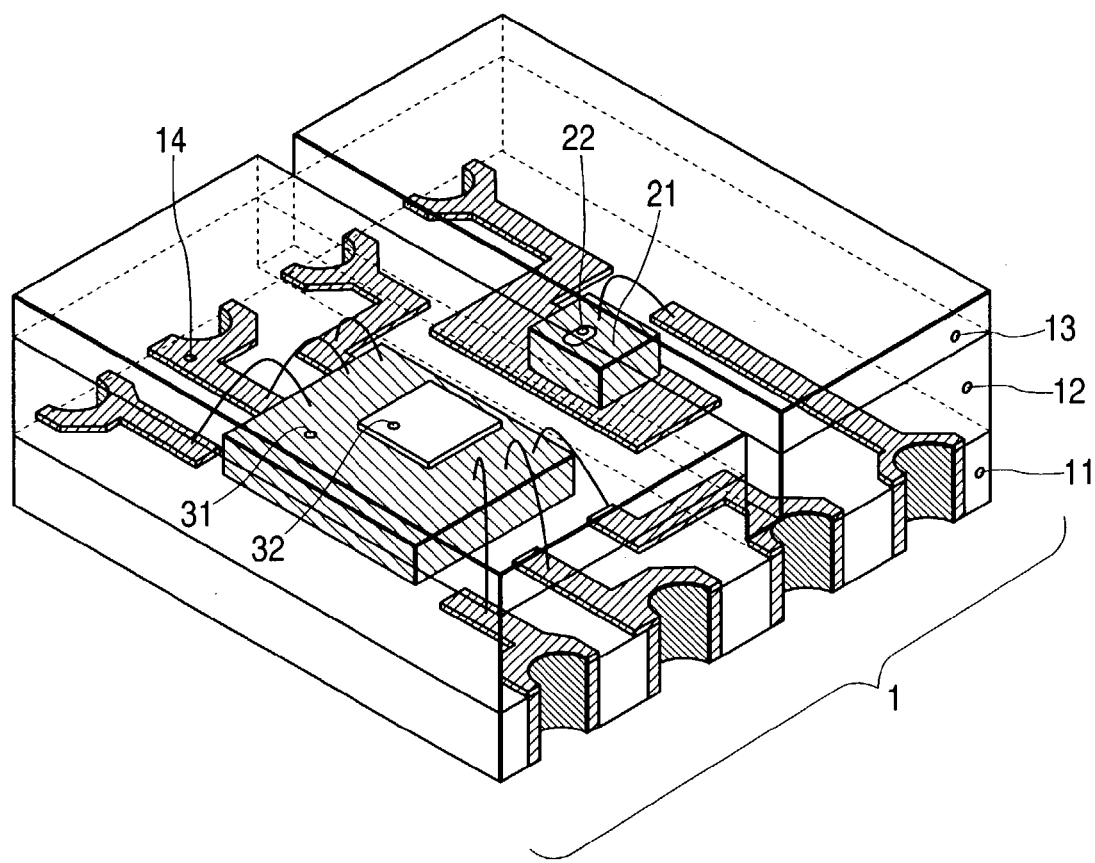
FIG. 3 is a perspective view of a light-shielding groove provided for the optical semiconductor package.

As can been from the perspective view shown in FIG. 3, the groove DW is disposed at the midpoint position between the light-emitting device 21 and the light-receiving device 31 and is a cut-through groove. It is possible to use various methods to produce the groove, although it is required that its cut surface is subjected to mirror-surface finishing if there is used a method such as cutting or grinding.

As a result of the mirror-surface finishing, rays of light are emitted from the light-emitting device so that there is reduced diffused component light of rays of light from the inside of the machine cut surface of the resin substrate and the glass substrate. Therefore, noise light hardly enters into the light-receiving device and there is realized a sufficient light-shielding performance. Note that in the case where the cut surface is a diffusing surface from an optical viewpoint, considerable rays of light enter the light-receiving portion, so that there occurs reduction in the light-shielding performance.

For this reason, in the second embodiment to be described next, there will be explained a construction where it is not required to perform the mirror-surface finishing on the machine cut surface and the light-shielding function of the present invention is sufficiently attained even if the mirror-surface finishing is not performed.

<Second Embodiment>

Figure 4:
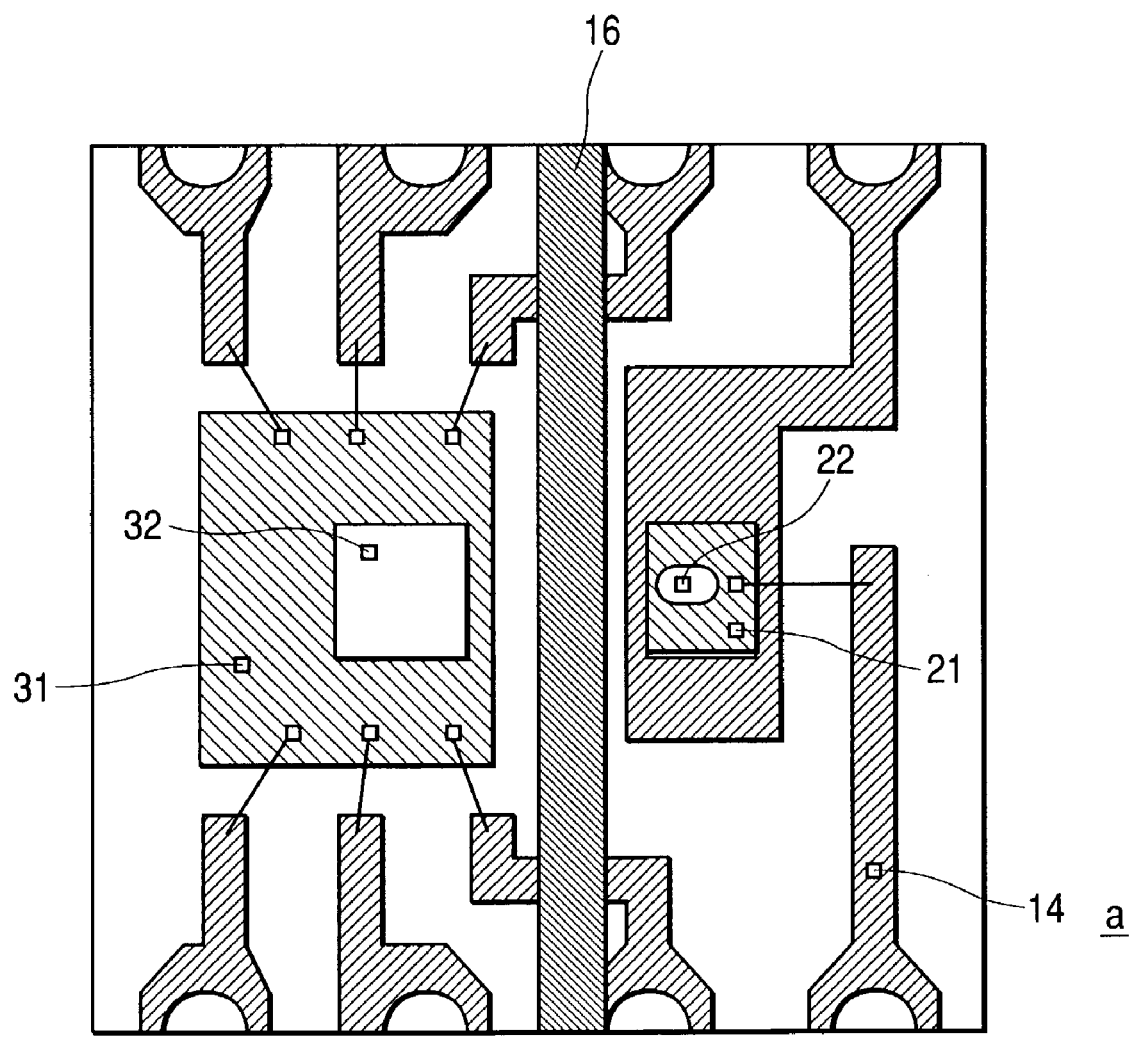
FIG. 4 is a plain view of an optical semiconductor package showing a second embodiment of the present invention.

FIG. 4 shows another form of the groove DW functioning as a light-shielding means. In this drawing, the light-shielding means is obtained by pouring a resin 16 having a light-shielding property into the groove portion of the first embodiment.

With this method, a high light-shielding performance is obtained at all times irrespective of the degree of finishing of the groove in the aforementioned first embodiment. Although the resin 16 having the light-shielding property becomes necessary, a reliable light-shielding means is obtained and a high substantial economical effect is achieved.

Figure 5A:
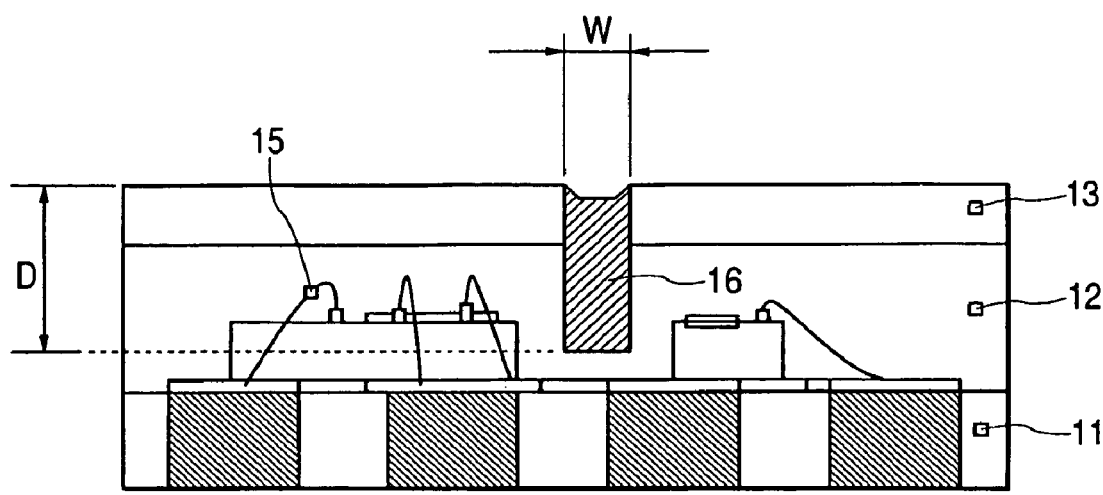
FIG. 5A is a side view of the optical semiconductor package.
Figure 6:
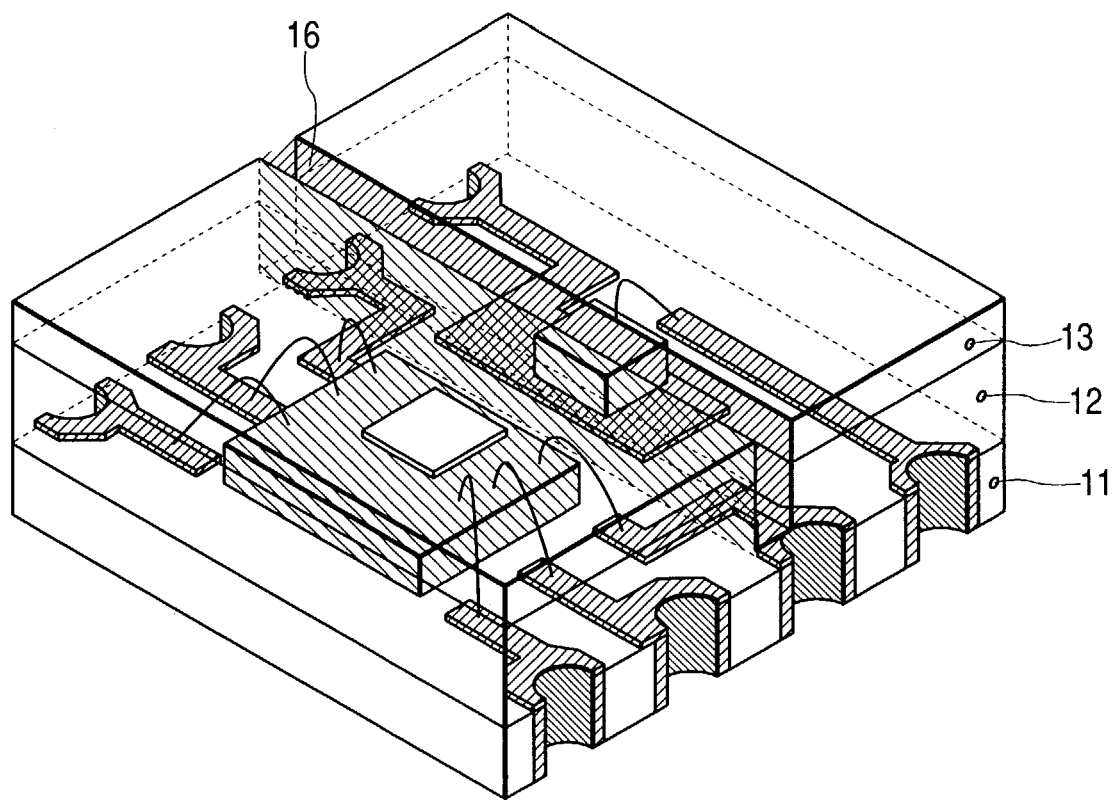
FIG. 6 is a perspective view of a light-shielding groove provided for the optical semiconductor package.

FIGS. 5A and 6 are a side view and a perspective view of the second embodiment, respectively.

Figure 5B:
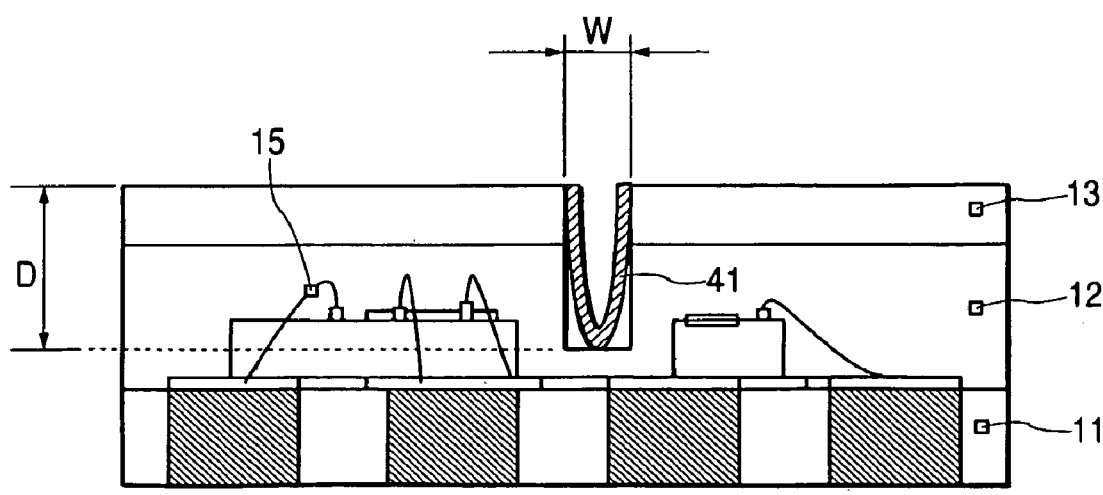
FIG. 5B is a side view of a modified example of the optical semiconductor package.
Figure 13A:
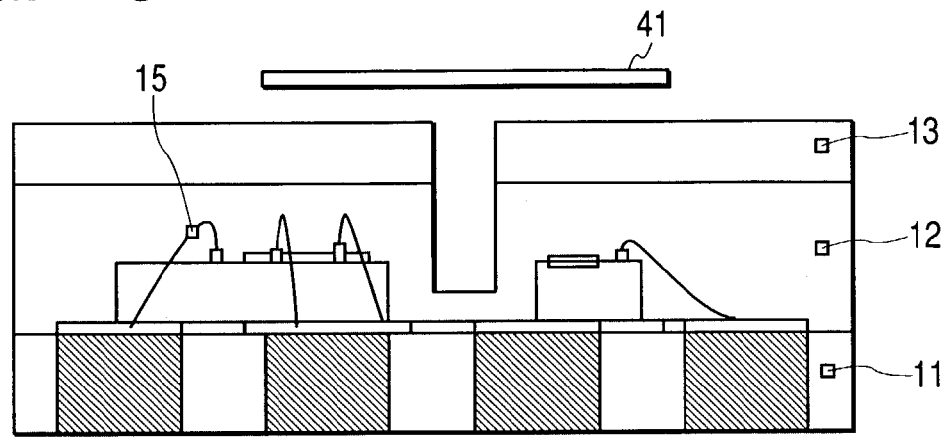
FIGS. 13A, 13B and 13C are a side view of an optical semiconductor package showing the insertion method of a sheet member having a light-shielding property in a modified example of a second embodiment of the present invention.
Figure 13B:
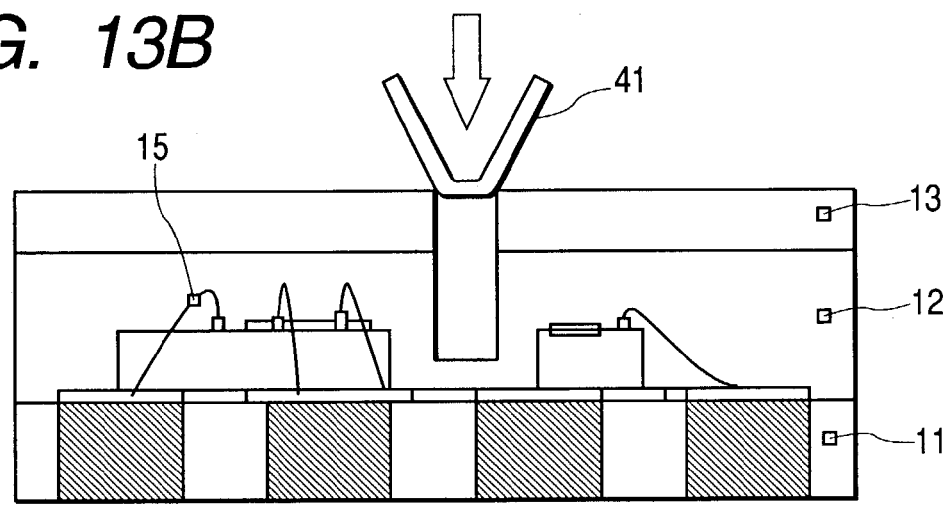
Figure 13C:
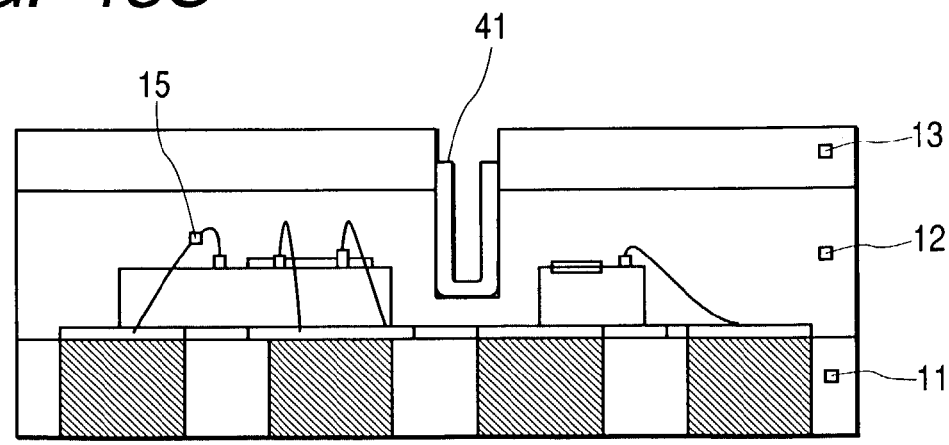
Figure 14:
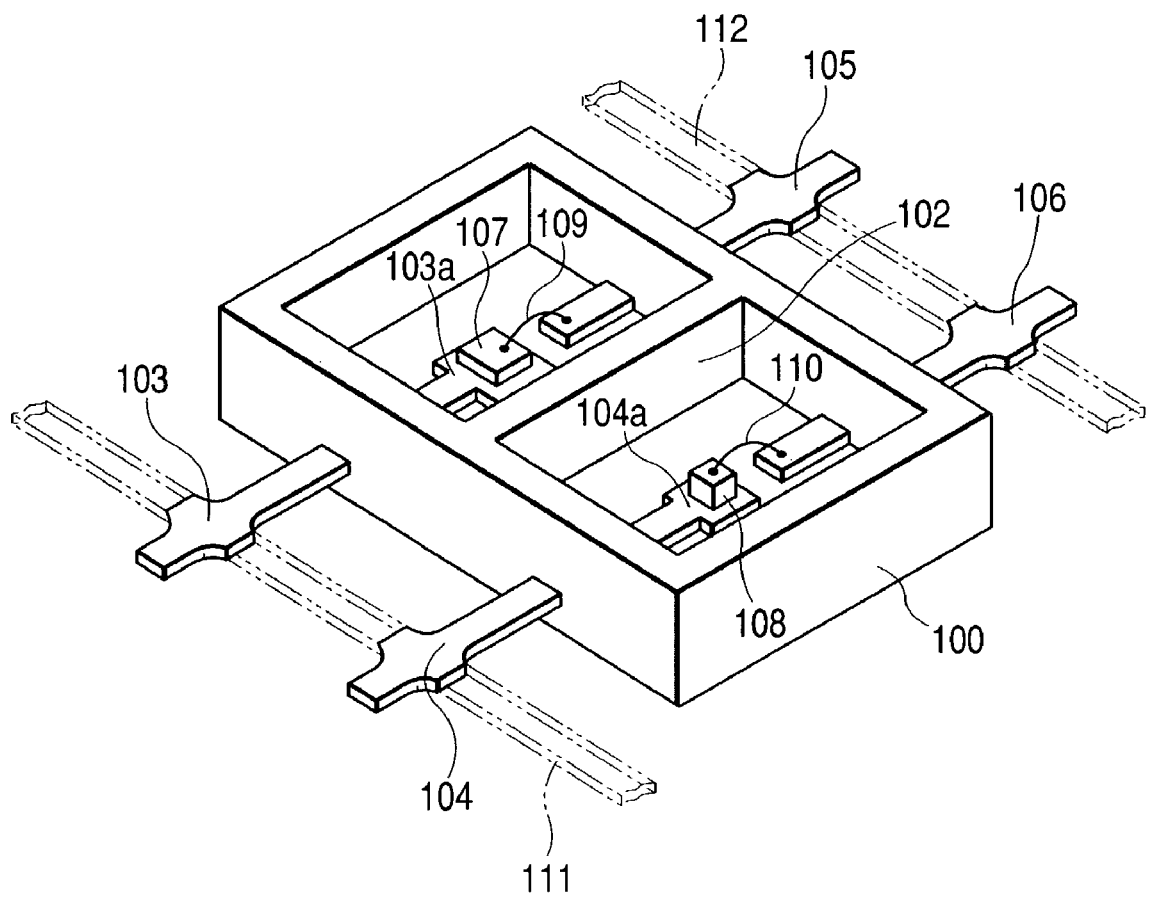
FIG. 14 is a perspective view of a conventional optical semiconductor package.

Here, it is not necessarily required to fill the groove with a light-shielding material in the manner shown in FIG. 4. That is, as a modification of this embodiment, it is possible to apply a coating having a light-shielding property to the machine cut surface of the groove. A light-shielding sheet member 41 as shown in FIG. 5B can be inserted into and mounted to the groove. FIGS. 13A to 13C show the method of inserting the light-shielding sheet member 41. As shown in FIGS. 13A to 13C, the light-shielding sheet member 41 can be readily mounted.

<Third Embodiment>

Figure 7:
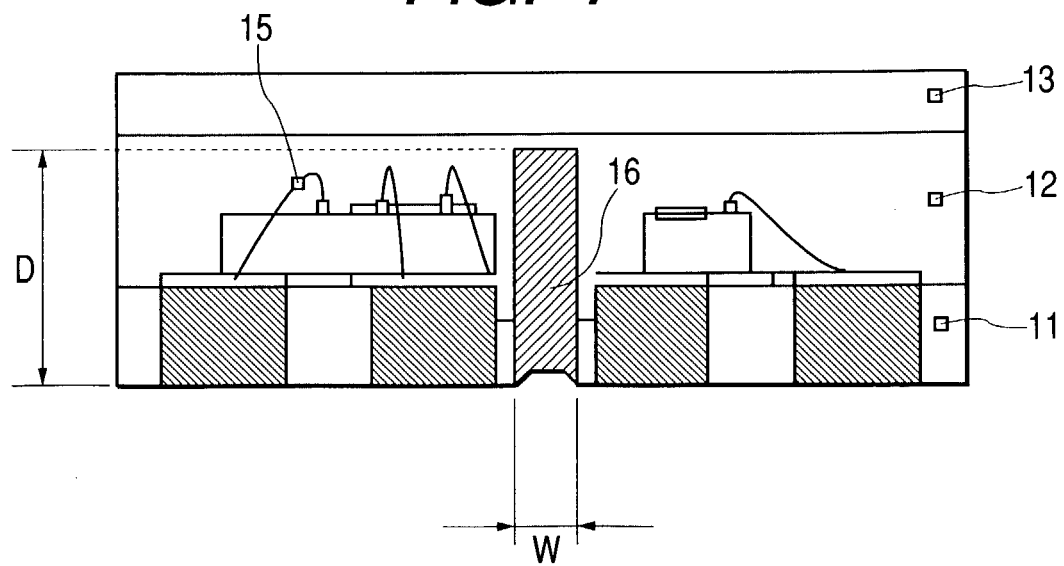
FIG. 7 is a side view of an optical semiconductor package showing a third embodiment of the present invention.
Figure 8:
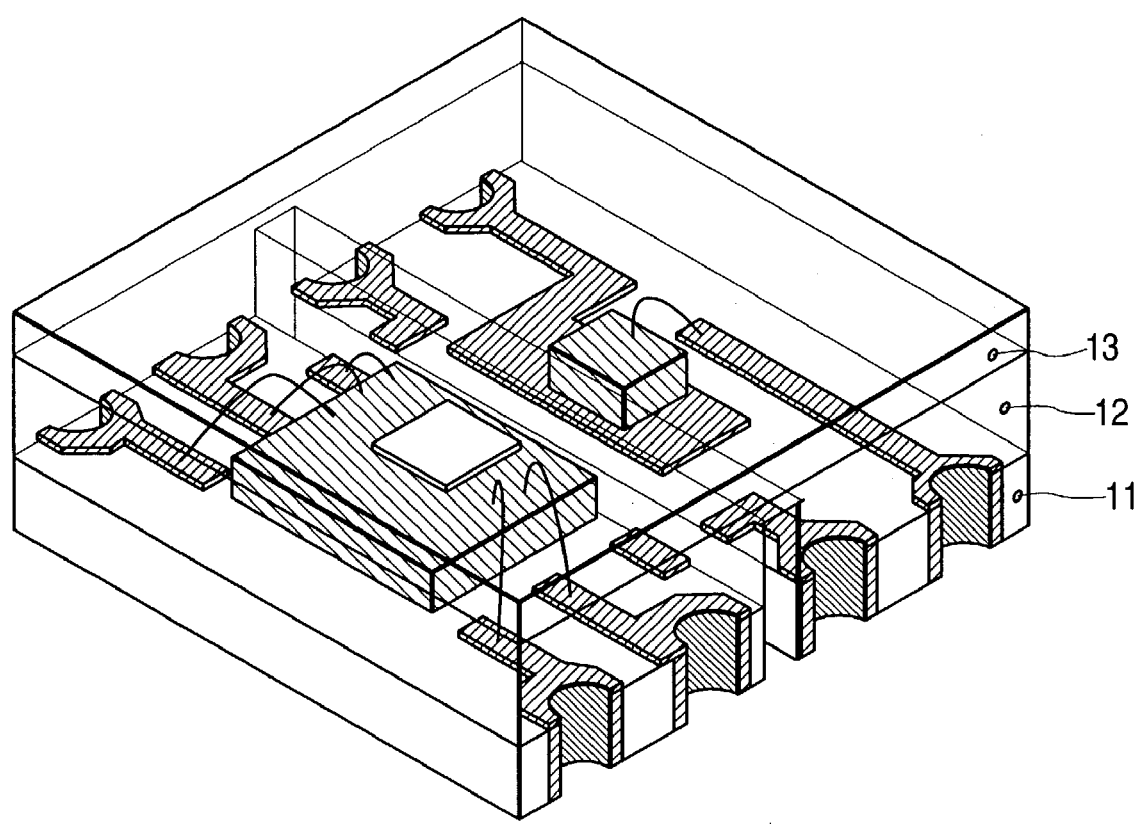
FIG. 8 is a perspective view of a light-shielding groove provided for the optical semiconductor package.

FIGS. 7 and 8 are an explanatory drawing and a perspective view of a third embodiment, respectively.

In the first and second embodiments, the groove is provided for the third layer and the second layer. In this third embodiment, however, the groove is provided for the printed wiring board 11 (first layer) and the transparent resin layer 12 (second layer).

In this embodiment, the wiring pattern is cut in the manner shown in the drawings, although if it is not required to use the electrodes, it becomes possible to perform groove production from a printed wiring board 11 side like in this embodiment and to shield light by filling the resin 16 having the light-shielding property in the manner shown in FIG. 7. Even in this case, a coating having a light-shielding property may be applied to the machine cut surface of the groove like in the aforementioned example.

<Fourth Embodiment>

In the optical semiconductor package of the present invention, the third layer is made of a glass substrate.

Figure 9:
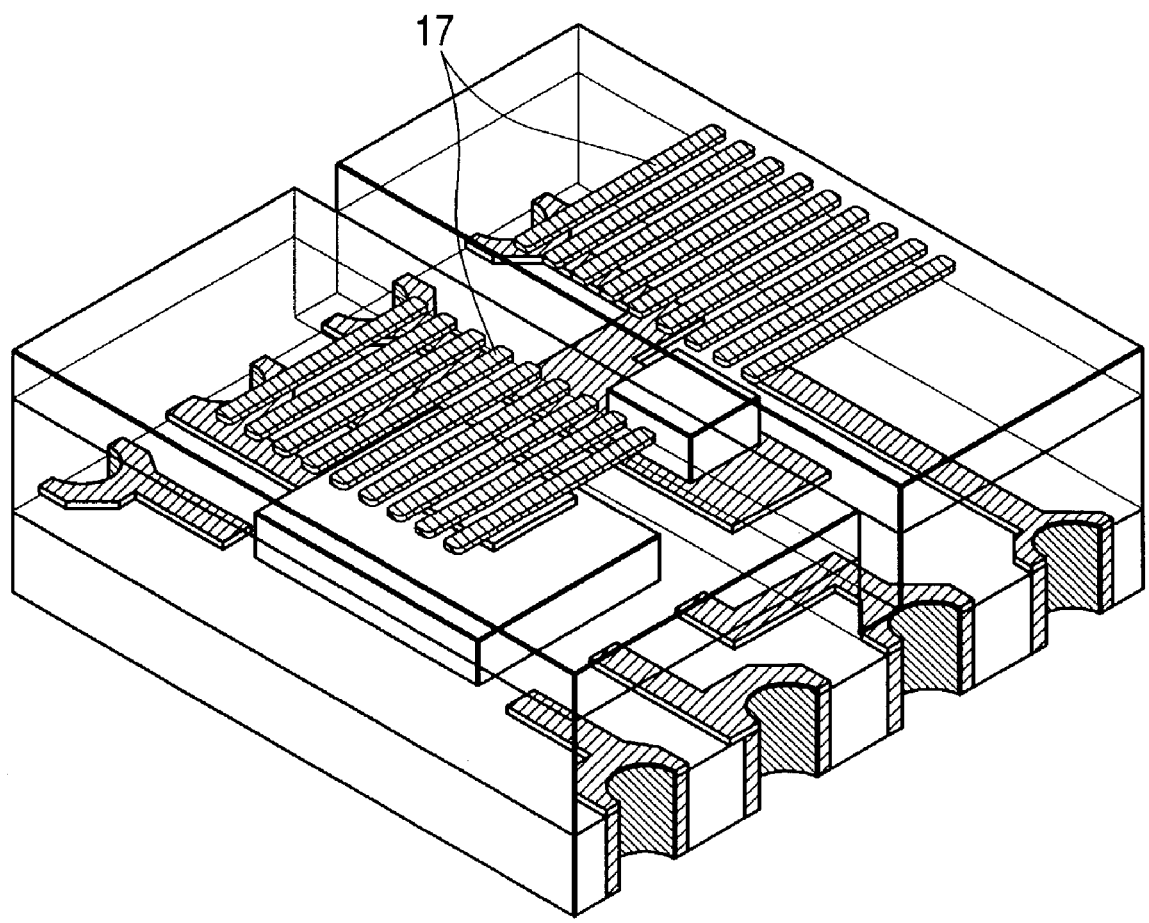
FIG. 9 is a perspective view of an optical semiconductor package showing a fourth embodiment of the present invention.

It is possible to mount various optical means on this substrate 13. In FIG. 9, diffraction gratings are arranged and are used as a reflection-type encoder. The diffraction gratings double as optical gratings and the third layer of the package of the present invention, so that it becomes possible to realize a very small reflection-type encoder.

<Fifth Embodiment>

Figure 10:
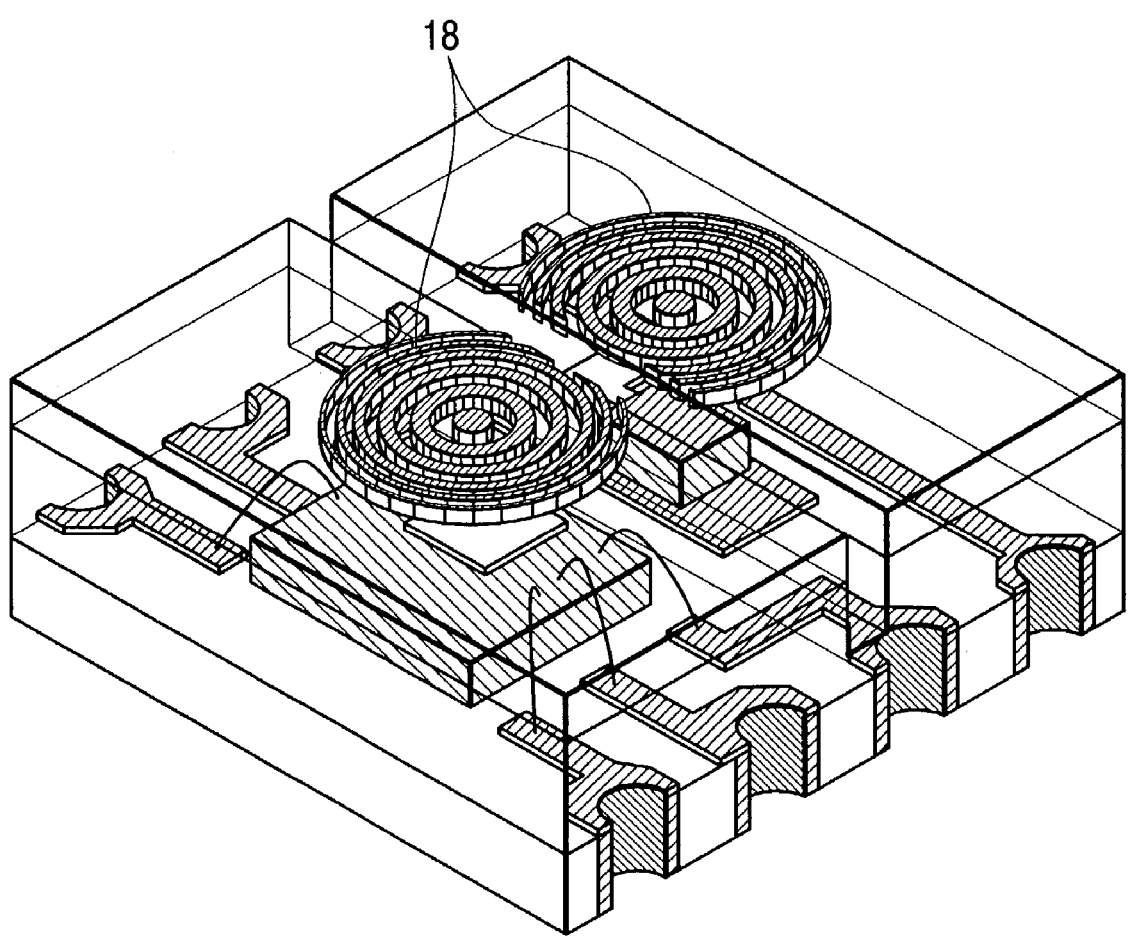
FIG. 10 is a perspective view of an optical semiconductor package showing a fifth embodiment of the present invention.

In a like manner as in the fourth embodiment, in FIG. 10, a phase grating-type Fresnel lens is formed on the top surface of the glass, so that it becomes possible to convert a divergent pencil of rays from the light-emitting device into a parallel pencil of rays and to guide the rays of light to the light-receiving device with efficiency.

Needless to say, a similar diffraction member 18 is provided also on a light-receiving side, so that there is further enhanced the usage efficiency of light.

<Sixth Embodiment>

Figure 11:
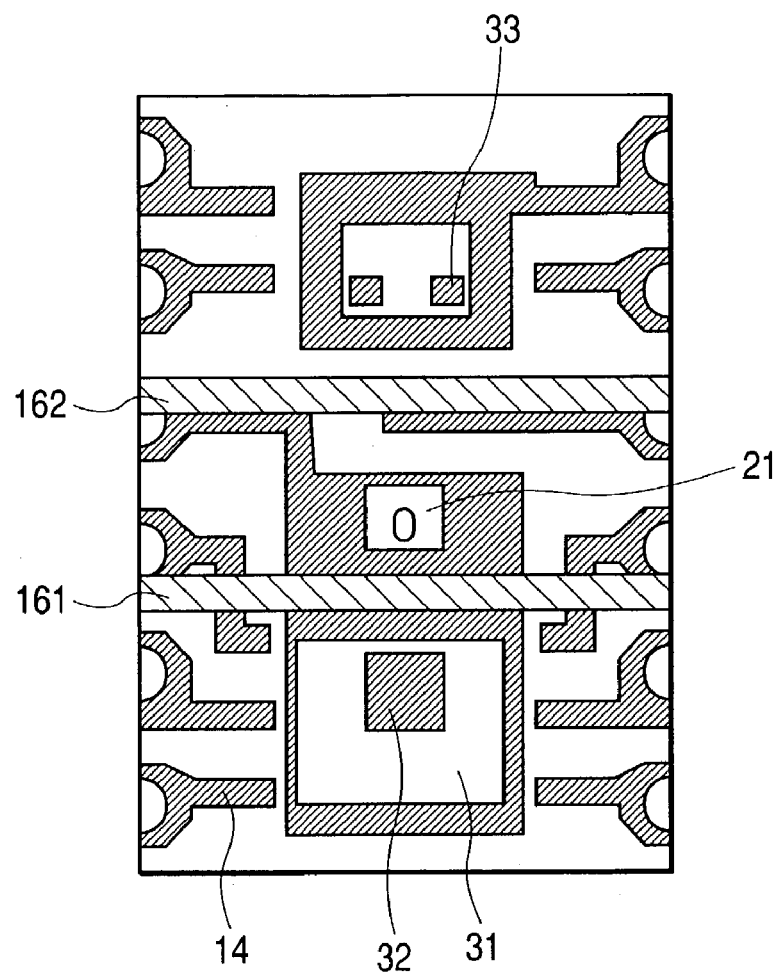
FIG. 11 is a plain view of an optical semiconductor package showing a sixth embodiment of the present invention.
Figure 12:
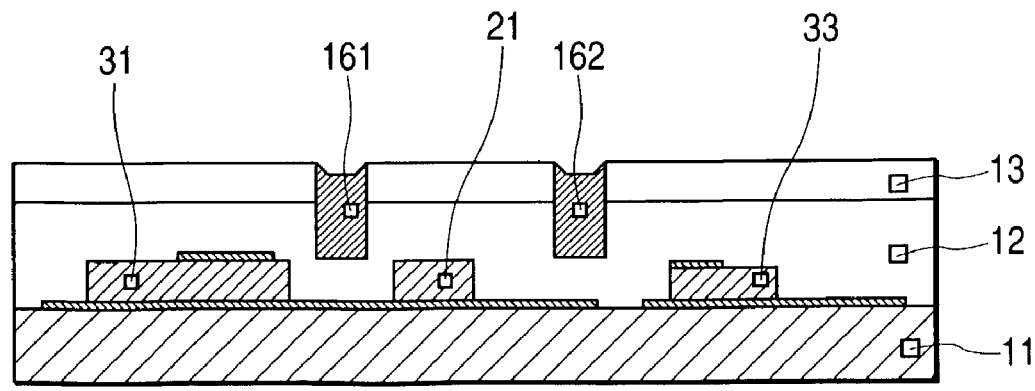
FIG. 12 is a side view of an optical semiconductor package showing a sixth embodiment of the present invention.

Although, in the first embodiment, each one of the light-emitting device and the light-receiving device is mounted on this substrate, in this sixth embodiment, a single light-emitting device is mounted and two light-receiving devices are mounted. FIG. 11 is a plain view of an optical semiconductor package of the sixth embodiment of the present invention, and FIG. 12 is a side view of an optical semiconductor package of the sixth embodiment of the present invention. In these drawings, similarly to the first embodiment, this printed wiring board 11 includes a groove at approximately the center between the light-emitting device 21 and the light-receiving device 31, and a circuit pattern 14 having a predetermined shape is formed immediately below the groove and on the right and left sides of the groove. Similarly to the second embodiment, a resin having a light-shielding property is injected into the groove portion so that the direct light from the light-emitting device is shielded certainly. Further, in this embodiment, the light-receiving device 33 is fastened to the opposite side of the light-receiving device 31 with respect to the light-emitting device 21. In order not to guide the direct light from the light-emitting device 21 to the light-receiving device 33, a groove is provided at approximately the center between the light-emitting device 21 and the light-receiving device 33, a circuit pattern 14 having a predetermined shape is formed immediately below the groove and on the right and left sides of the groove, and a light-shielding resin is injected into groove similarly to the second embodiment.

In this embodiment, there is no restriction in the number of the light-emitting devices and the light-receiving devices fastened on this printed wiring board 11.

As described above, with the construction of the present invention, there is provided a light-shielding means having a high light-shielding performance. In addition, the third layer is a transparent glass substrate, so that it is possible to obtain high flatness. Therefore, in the case where a coherent light source, such as a semiconductor laser, a surface emitting laser, or a point light source LED having a current bottleneck structure, is mounted as the light-emitting device, for instance, it is possible to emit light to the outside of the optical semiconductor package without causing any deleterious effect on the surface accuracy of the light emitting wave surface. In a like manner, also on the light-receiving surface side, it becomes possible to perform light reception while suppressing distortion of the wave surface of the light wave as much as possible. Accordingly, in particular, the optical semiconductor package of the present invention is of high utility value as a package for a sensor device designed for highly accurate optical measurement.

In a like manner, in the case where a fine-pitch light-receiving device array is used on the light-receiving device surface, for instance, if the flatness of the third layer is low, desired rays of light do not enter each light-receiving area of the light-receiving device array and therefore there is incurred performance degradation. With the present invention, however, the performance is substantially improved.

In particular, in the case of a circuit pattern construction where a circuit on the light-emitting device side and a circuit on the light-receiving device side are connected to each other, it has been difficult to use a light-shielding means, which completely divides the area of a light-emitting device from the area of a light-receiving device, on the layout surface of the circuit pattern. With the light-shielding means of the present invention, however, there is obtained an advantage that it becomes possible to establish connection of the circuit pattern between the light-emitting device side and the light-receiving device side without cutting the circuit pattern.

Also, the surrounding member 12 described in the aforementioned embodiments is formed using a transparent resin material. In the case where the emission light of the light-emitting device 21 is near-infrared light, however, the material of the surrounding member 12 is not particularly limited to this and a visually opaque material may be used instead so long as the material has a light transmission property with reference to the near-infrared light.

It is possible to replace the transparent glass substrate layer (third layer) with another member that is, for instance, a transparent resin sheet member such as a PET sheet member or a polycarbonate sheet member.

The optical semiconductor package according to the present invention has the following advantages.
(1) It is not required to use high-priced components such as the lead frames 3, 4, 5, and 6, so that there is reduced product cost.
(2) The device case 1 becomes unnecessary, so that there is reduced the size of the device in comparison with the conventional product.
(3) It is possible to form the light incident portion and the light emitting portion so as to have a shape achieving a high optical effect, so that there is enhanced device accuracy.
(4) The mounting of the light-emitting device 21 and the light-receiving device 31, the connecting of the wire 15, and the like are performed in a wide space, so that the work range of a work machine is not limited and therefore there is improved productivity.
(5) The groove DW is not formed on the circuit pattern, so that it becomes possible to make connection of the circuit pattern across the light-shielding member. As a result, there is increased flexibility in designing and there is obtained an advantage also from the viewpoint of miniaturization designing.

What is claimed is:
1. A package for an optical semiconductor comprising
a wiring board on which a light-emitting device and a light-receiving device are mounted and which has a circuit pattern for wiring of said devices;
a surrounding member layer made of a resin material having a light transmittance property so as to cover outer surfaces of the light-emitting device and the light-receiving device;
a substrate member layer made of a transparent material covering the outer surface of the surrounding member layer; and
a straight groove formed in said surrounding member and said substrate member between the light-emitting device and the light-receiving device,
wherein said straight groove is filled with a material having light shielding property and, has a depth which extends from a side from which light beam emitted from the light-emitting device emerges outside and which does not reach said wiring board so that at least a conducting portion of the circuit pattern on said wiring board exists below said straight groove such that the light-emitting device and light-receiving device are connected electrically passing under the groove.

2. A package for an optical semiconductor according to claim 1, wherein a glass substrate layer having a light transmittance property is provided on the surrounding member layer.

3. A package for an optical semiconductor according to claim 2, wherein the glass substrate layer is a light diffraction member.

4. A package for an optical semiconductor according to claim 1, wherein a sheet member having a light-shielding property is inserted into the groove.

5. A package for an optical semiconductor according to claim 1, wherein surfaces of the groove are subjected to mirror surface finishing.

* * * * *